United States Patent
Wann et al.

(10) Patent No.: US 9,455,325 B2
(45) Date of Patent: Sep. 27, 2016

(54) FIN FIELD-EFFECT TRANSISTORS HAVING CONTROLLED FIN HEIGHT

(71) Applicant: TAIWAN SEMICONDUCTOR MANUFACTURING COMPANY, LTD., Hsinchu (TW)

(72) Inventors: Clement Hsingjen Wann, Carmel, NY (US); Ling-Yen Yeh, Hsinchu (TW); Chi-Yuan Shih, Hsinchu (TW); Yuan-Fu Shao, Taipei (TW); Wen-Huei Guo, Chu-bei (TW); Tung Ying Lee, Hsinchu (TW)

(73) Assignee: TAIWAN SEMICONDUCTOR MANUFACTURING COMPANY, LTD. (TW)

( * ) Notice: Subject to any disclaimer, the term of this patent is extended or adjusted under 35 U.S.C. 154(b) by 0 days.

(21) Appl. No.: 14/692,823

(22) Filed: Apr. 22, 2015

(65) Prior Publication Data

US 2015/0228743 A1 Aug. 13, 2015

Related U.S. Application Data

(62) Division of application No. 13/403,630, filed on Feb. 23, 2012, now Pat. No. 9,041,158.

(51) Int. Cl.
*H01L 29/06* (2006.01)
*H01L 21/302* (2006.01)
*H01L 29/423* (2006.01)
*H01L 21/8234* (2006.01)
*H01L 21/84* (2006.01)
*H01L 29/02* (2006.01)
*H01L 29/78* (2006.01)

(52) U.S. Cl.
CPC . *H01L 29/42368* (2013.01); *H01L 21/823431* (2013.01); *H01L 21/845* (2013.01); *H01L 29/02* (2013.01); *H01L 29/06* (2013.01); *H01L 29/0653* (2013.01); *H01L 29/7856* (2013.01)

(58) Field of Classification Search
CPC ..... H01L 21/62; H01L 21/302; H01L 29/06; H01L 21/3111; H01L 21/31155; H01L 21/76237
USPC .................. 257/368, 618; 438/423
See application file for complete search history.

(56) References Cited

U.S. PATENT DOCUMENTS

| | | | |
|---|---|---|---|
| 7,977,248 B2 * | 7/2011 | Tan et al. | 438/717 |
| 8,357,569 B2 | 1/2013 | Pawlak | |
| 2004/0099985 A1 * | 5/2004 | Proulx et al. | 264/172.14 |
| 2006/0175667 A1 | 8/2006 | Tsuchiaki | |
| 2007/0145431 A1 * | 6/2007 | Kim et al. | 257/288 |
| 2009/0124069 A1 | 5/2009 | Clark, Jr. et al. | |

(Continued)

*Primary Examiner* — Phuc Dang
(74) *Attorney, Agent, or Firm* — Hauptman Ham, LLP

(57) ABSTRACT

An apparatus includes a semiconductor substrate having a plurality of fins, wherein the plurality of fins includes a first group of fins and a second group of fins. The apparatus further includes a high fin density area on the semiconductor substrate including a first dielectric between the first group of fins in the high fin density area, said first dielectric having a first dopant concentration. The apparatus further includes a low fin density area on the semiconductor substrate including a second dielectric between the second group of fins in the low fin density area, said second dielectric having a second dopant concentration. The first dielectric and the second dielectric are a same material as deposited and the first dopant concentration and the second dopant concentration are different.

20 Claims, 10 Drawing Sheets

(56) References Cited

U.S. PATENT DOCUMENTS

| | | |
|---|---|---|
| 2009/0170316 A1 | 7/2009 | Tan et al. |
| 2009/0206445 A1* | 8/2009 | Fujimoto et al. ............. 257/506 |
| 2010/0075480 A1 | 3/2010 | Liao et al. |
| 2011/0156148 A1 | 6/2011 | Yu et al. |
| 2011/0201186 A1 | 8/2011 | Siprak |
| 2012/0032267 A1* | 2/2012 | Cheng et al. ................. 257/368 |
| 2013/0009246 A1* | 1/2013 | Cheng et al. ................. 257/350 |
| 2013/0093026 A1 | 4/2013 | Wann et al. |
| 2013/0149826 A1* | 6/2013 | Lee et al. ...................... 438/270 |
| 2013/0270559 A1 | 10/2013 | Hafez et al. |
| 2013/0280883 A1* | 10/2013 | Faul et al. .................... 438/434 |

* cited by examiner

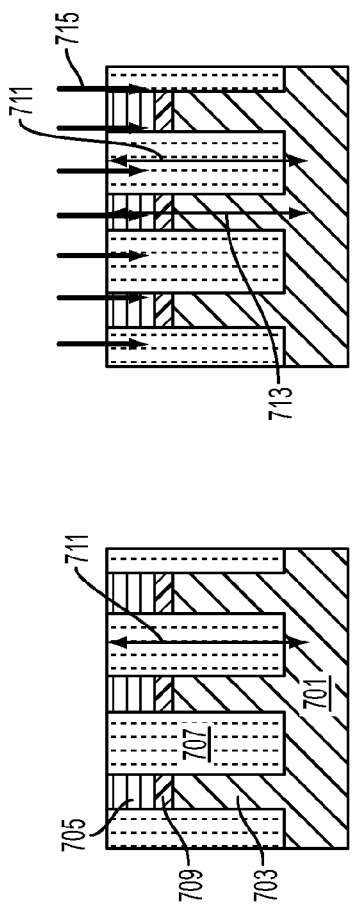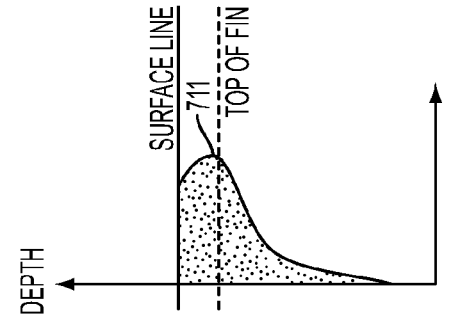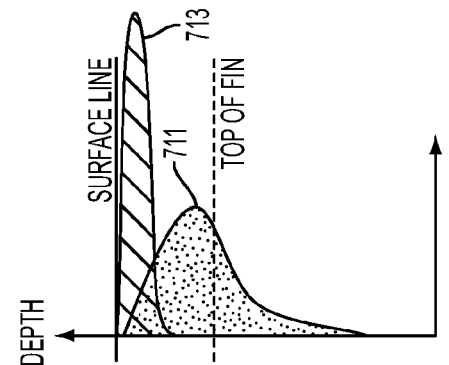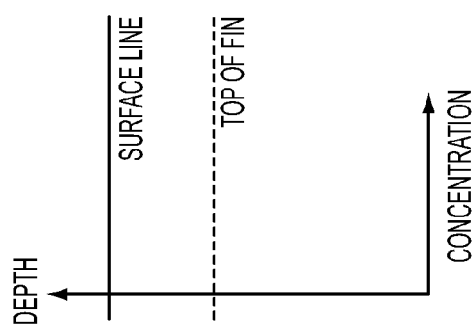

FIN FIELD-EFFECT TRANSISTORS HAVING CONTROLLED FIN HEIGHT

PRIORITY CLAIM

The present application is a divisional of U.S. application Ser. No. 13/403,630, filed Feb. 23, 2012, U.S. Pat. No. 9,041,158; which is incorporated herein by reference in its entirety.

TECHNICAL FIELD

The disclosure relates generally to integrated circuit devices, and more particularly to structure and methods for forming fin field-effect transistors (FinFETs).

BACKGROUND

In the rapidly advancing semiconductor manufacturing industry, complementary metal oxide semiconductor (CMOS) FinFET devices may be used in many logic circuits and other applications and are integrated into various different types of semiconductor devices. FinFET devices typically include semiconductor fins having high aspect ratios in which the channel and source/drain regions for the transistor are formed. A gate is formed over and along the sides of a portion of the semiconductor fins. The increased surface area of the channel and source/drain regions in a FinFET as compared to a planar transistor having the same area results in faster, more reliable and better-controlled semiconductor transistor devices.

Different FinFETs having different fin pitches are used in different areas of a semiconductor apparatus. The differences in fin pitch results in different areas having different fin densities. During fin formation, a localized etch loading effect causes areas having different fin densities to have different fin heights. Depending on the etch process, low fin density areas may have longer fins or shorter fins relative to high fin density areas.

Process-induced fin height variations affect the electrical properties of the FinFETs. While chemical and process tuning can improve the fin height uniformity, better fin height control in different fin density areas continues to be sought.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

FIGS. 7A to 7E are cross section views of partially fabricated FinFETs according to various steps in the method embodiments of the present disclosure.

FIGS. 8A to 8E are graphs of dopant concentration profiles of partially fabricated FinFETs of FIGS. 7A to 7E according to various embodiments of the present disclosure.

DETAILED DESCRIPTION

Figure 1:
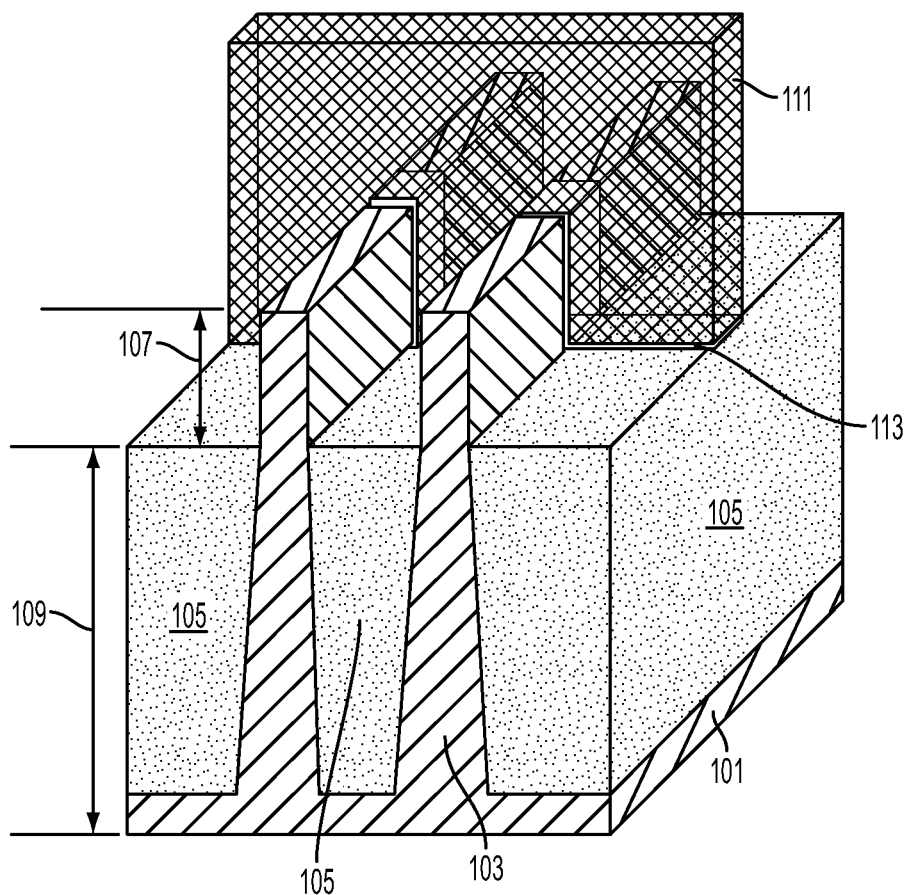
FIG. 1 is a fin field-effect transistor (FinFET).

The making and using of illustrative embodiments are discussed in detail below. It should be appreciated, however, that the disclosure provides many applicable inventive concepts that can be embodied in a wide variety of specific contexts. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. Of course, the description may specifically state whether the features are directly in contact with each other. In addition, the present disclosure may repeat reference numerals and/or letters in the various examples. The specific embodiments discussed are merely illustrative and do not limit the scope of the invention.

In some embodiments, fin field-effect transistors (FinFETs) have a substantially rectangular fin structure formed in one of two ways. In one method, shallow trench isolation (STI) features 105 are formed first on bulk silicon material, shown in FIG. 1 as substrate 101, by first depositing an isolation material, for example, a dielectric such as silicon oxide or silicon nitride over silicon, and then etching trenches to form STI features. The bottom of the trenches between the STI features are exposed bulk silicon. Silicon is then grown in the trenches to form fins 103 by using, for example, an epitaxial process. Once a desired fin height is reached, the STI 105 is etched to a level below a top of the fin to expose a portion of the fin. The exposed portion of the fin is a top portion 107 and an embedded portion is a bottom portion 109. The substrate 101 is a bulk silicon material that may be a silicon wafer or a deposited silicon such as silicon-on-insulator (SOI) with a barrier oxide (BOX) layer between the SOI and the underlying silicon substrate. Using this method, the STI features 105 define the size and shape of the fins 103. Depending on etch parameters used when the trenches are formed, the fins 103 may have a variety of substantially rectangular shapes, including a slight angle at the bottom portion 109 of the fin as shown in FIG. 1.

In another method, bulk silicon on a substrate is etched into a rectangular fin shape by first patterning and depositing a hardmask layer on the bulk silicon. The hardmask forms a pattern covering the top of the fins. The bulk silicon is then etched to form trenches between the regions covered by the hardmask layer. The trenches are formed into shallow trench isolation (STI) features 105 by depositing a dielectric material, usually silicon oxide. The dielectric material is usually deposited in excess to completely cover the fins 103 and optionally the hardmask layer, if not yet removed. The dielectric material is planarized down to a top surface of the fins or hardmask, and then etched to a level below the top surface of the fins so that a portion of the fins protrude above the STI features 105. The protruded fin portion is a top portion 107 and an embedded fin portion is a bottom portion 109.

In a variation of the second method, the hardmask for etching into the bulk silicon is formed by a process using mandrels. A photoresist pattern is formed and used to etch a mandrel pattern. A conformal spacer material is then deposited around the mandrel. The conformal spacer is usually formed of a hardmask material forming a spacer sidewall thinner than that of the mandrel. The mandrel material between the spacers is then removed in subsequent etching operations to leave just the spacers behind. Some of the spacers are then used as a hardmask for etching the underlying silicon layers to form the fin structures. Using the mandrel/spacer method, thinner fins that are closer together can be formed than the first method or the unmodified second method. The exposed top fin portions 107 have a height dimension (h), a width dimension (w) and a length dimension (l). Some electrical properties of the FinFET can be defined relative to these dimensions. For example, an effective channel width for the transistor may be calculated using the dimension of the fins under the gate. As shown in FIG. 1, the effective channel width is 2 fins, or $2 \times (2h+w)$. Note that the effective channel width does not include the distance between fins.

The remaining FinFET forming process steps are described here to provide context for the present disclosure. A gate dielectric layer 113 and gate electrode layer 111 are deposited over the fins 103 and the STI features 105. Gate dielectric layer 113 is formed of a high dielectric constant (high-k) dielectric material. The exemplary high-k materials may have k values greater than about 4.0, or even greater than about 7.0, and may include aluminum-containing dielectrics such as $Al_2O_3$, HfAlO, HfAlON, or AlZrO; Hf-containing materials such as $HfO_2$, $HfSiO_x$, $HfAlO_x$, $HfZrSiO_x$, or HfSiON; and/or other materials such as $LaAlO_3$ or $ZrO_2$. Gate electrode layer 111 is formed on the gate dielectric layer 113, and may be formed of a conductive material such as doped polysilicon, metals, or metal nitrides.

The gate electrode layer 111 and gate dielectric layer 113 are then patterned to form gate stacks over a middle portion of the fins 103. Fin portions not under the gate stacks are then optionally doped to form lightly doped drain and source (LDD) regions. The dopant used depends on the conductivity type of the transistor. The LDD regions may be doped by ion-implanting or by plasma doping where dopants are deposited onto the fin 103 and annealed. Source and drain regions are formed across the gate stack. Source and drain regions may be formed by ion-implanting a source/drain region or by removing a portion of the fin and epitaxially re-growing the removed portion under doping conditions to form a source/drain region.

A circuit designer specifies transistors in his design according to electrical properties for performing various functions. Electrical properties considered include turn on voltage (threshold voltage), breakdown voltage, on-state current ($I_{on}$), leakage current, as well as other electrical properties. The on-state current is the current that may be driven through the transistor when the gate voltage is equal to the threshold voltage. The on-state current is proportional a channel width. While usually a range of on-state currents may be acceptable, depending on the circuit functionality and application, knowing a channel width for a FinFET with relative certainty increases design flexibility and operating window for a FinFET.

Various embodiments of the present disclosure pertain to methods for forming fins in different fin density areas with high overall uniformity as to fin height or high localized area uniformity for a specific fin height and structures resulting from the methods for forming fins. As discussed, etching an STI features exposes a top portion of the fin, which has a height hereinafter referred to as fin height. Etch loading effects can vary the thickness etched by greater than 10% between high fin density areas and low fin density areas.

Figure 2A:
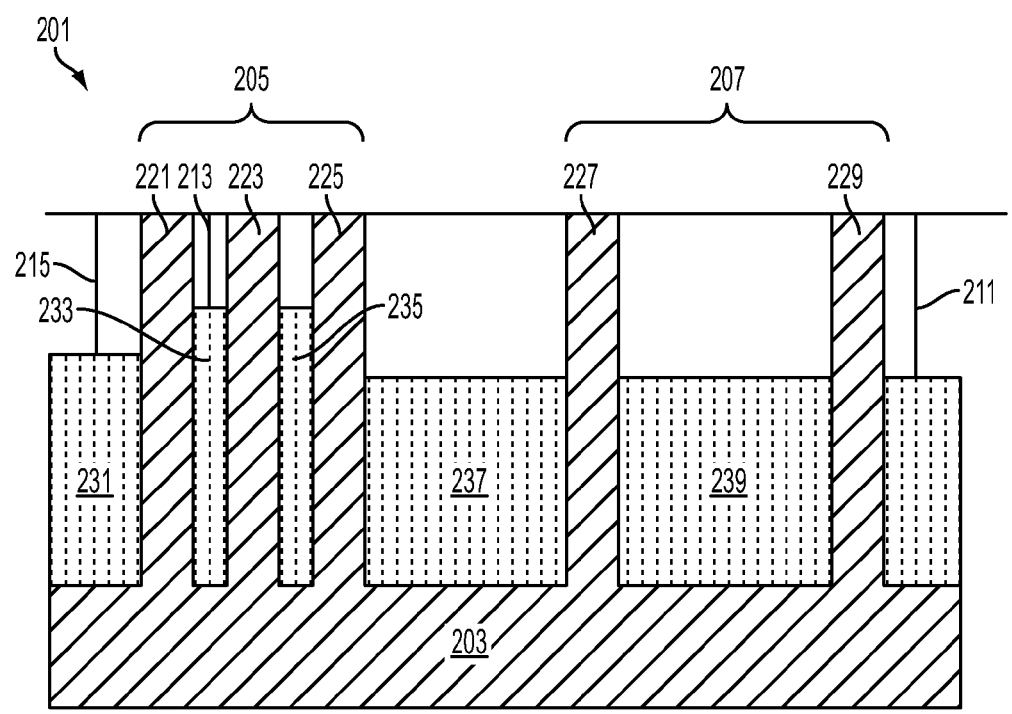
FIGS. 2A and 2B are cross section and top views of different fin density areas of a semiconductor device.
Figure 2B:
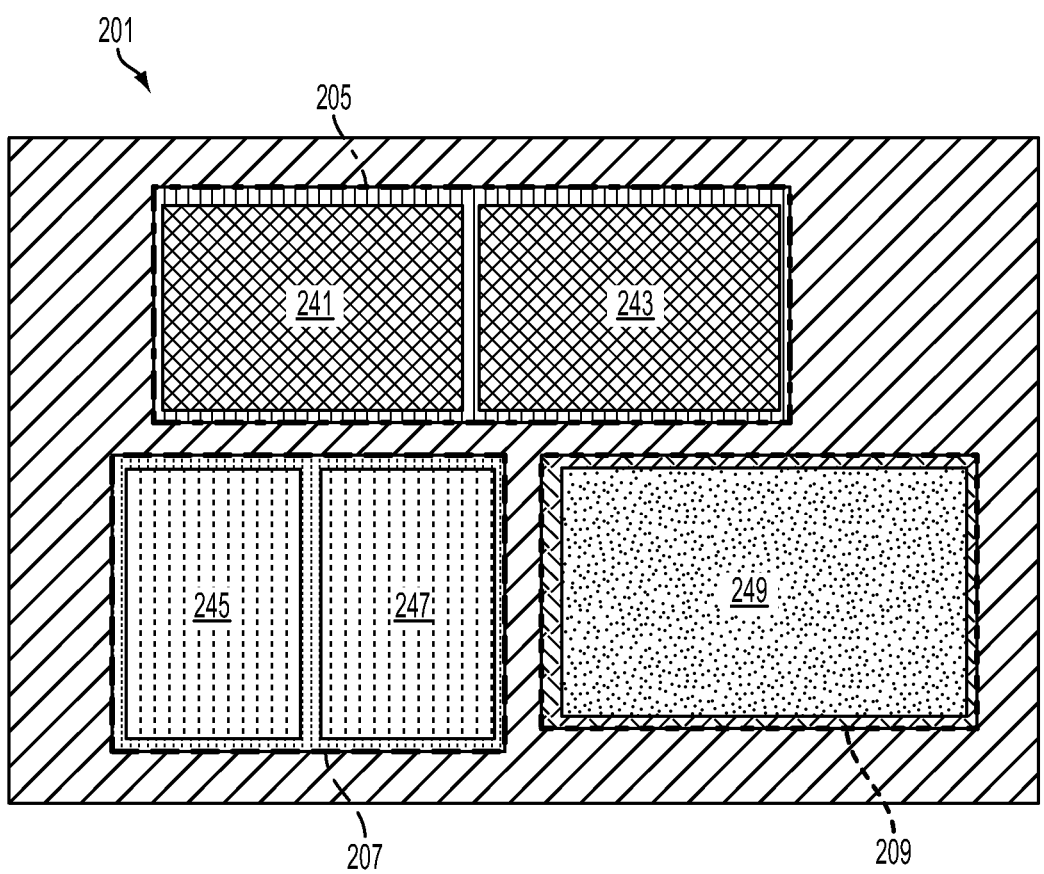

FIGS. 2A and 2B are cross section and top views, respectively, of different fin density areas of a semiconductor device 201. FIG. 2A shows the semiconductor device 201 having two different fin density areas 205 and 207 over substrate 203. Fin density area 205 includes fins 221, 223, and 225 that are spaced closer together, i.e., having a smaller pitch, than the fins 227 and 229 of fin density area 207. Thus fin density area 205 is a higher density area in semiconductor device 201 and fin density area 207 is a low density area. Because of localized etch effects, after etching dielectrics 231, 233, 235, 237 and 239 between the fins, different fin heights 215, 213, and 211 result. In the low density area 207, a fin height 211 results. Internal to the high density area 205, a fin height 213 results. External to the high density area, as shown over dielectric 231, a fin height 215 results. Fin height 211 is greater than fin height 213. Fin height 211 and 215 are similar but are not necessarily the same, depending on the fin density in the area to the left side of dielectric 231. For example, if the fin density in the area to the left side of dielectric 231 is about the same as area 207, then fin height 215 would be similar to fin height 211.

Localized loading etch effects can have at least two kinds of results depending on the etching process and chemistry involved in the etching process. In one type as shown in FIG. 2A, lower density regions are etched more. In one example, lower etchant concentration due to mass transfer limitations within narrow features limit the etching rate in high density areas. In low density areas, the etchant concentration is not limited by mass transfer, so the reaction rates are higher. In another type, lower density regions are etched less. In these types, redeposits of etched material play a role. In one test, a fin that borders different density areas see a fin height of 30.7 nm (nanometers) on one side and 19 nm on the other side for a difference of 30%. On the same die, regions with similar fin density resulted in fin heights of 26.7 nm and 27.4 nm. Thus, the difference in fin height can result in FinFETs having channel widths that are even more different as any fin height difference is doubled for the channel width.

FIG. 2B shows the semiconductor device 201 having different fin density areas 205, 207, and 209. A device may have many fin density areas. For many devices, functional areas are correlated to fin densities, although many exceptions apply. In one example, logic areas on a device have the highest fin density as the FinFET are small and made close together. Memory areas may have fins spaced further apart. Input/output areas include analog circuit and have fewer and larger transistors. In the example of FIG. 2B, area 205 is a logic area, having two processor units 241 and 243. Area 207 is a memory area having two memory banks 245 and 247. Area 249 is an input/output area having one input/output module 249. While functional areas may be a good proxy for fin density in many circumstances, the various concepts in the present disclosure apply to other fin density area grouping that can distinguish areas by fin density.

Figure 3A:
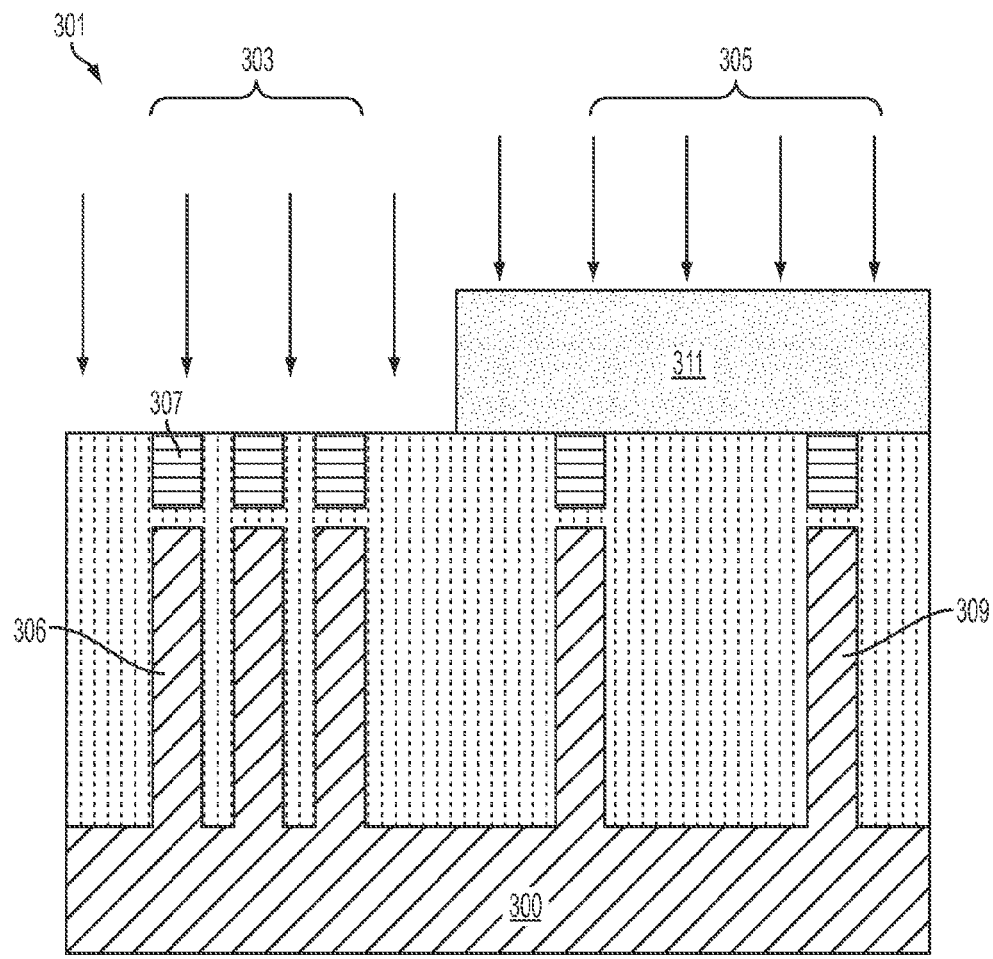
FIGS. 3A and 3B are cross section views of partially fabricated FinFETs in accordance with various embodiments of the present disclosure.
Figure 3B:
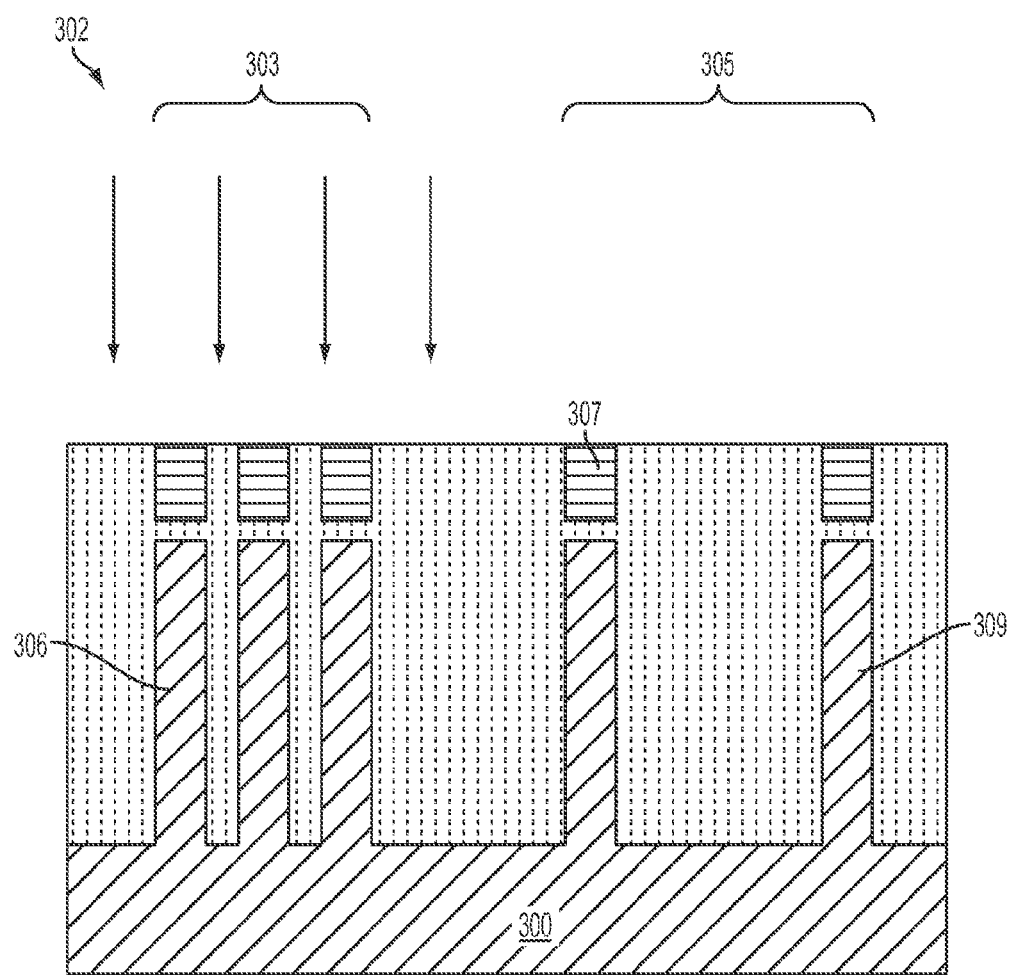

FIGS. 3A and 3B are cross section views of partially fabricated FinFETs in accordance with various embodiments of the present disclosure. Difference in fin heights due to etching loading effects is reduced by selectively doping the dielectric layer between the fins in different fin density areas of the device. FIG. 3A shows a device 301 on a substrate 300 having different fin density areas 303 and 305. The fins are capped by a hardmask layer 307 during a formation process. Fins 306 of the high density area 303 and surrounding dielectric areas are exposed to a dopant by ion implantation or thermal diffusion as shown by arrows 313 while the fins 309 of the low density area 305 are protected by a photomask 311. In FIG. 3A, the selective doping is achieved by protecting certain areas of the device from being doped.

FIG. 3B shows a device 302 on the substrate 300 having different fin density areas 303 and 305. The fins are capped by a hardmask layer 307 during the fin formation process. Fins 306 of the high density area 303 and surrounding dielectric areas are exposed to a dopant by controlled ion implantation as indicated by arrows 313 while the fins 309 of the low density area 305 are not exposed to the dopant. In FIG. 3B, the selective doping is achieved by the ion implantation tool targeting its beams only at selected areas. Because fin density varies little for a large area of the die having similar functions, tool-controlled precision is enough to separate areas of different fin densities.

Figure 4:
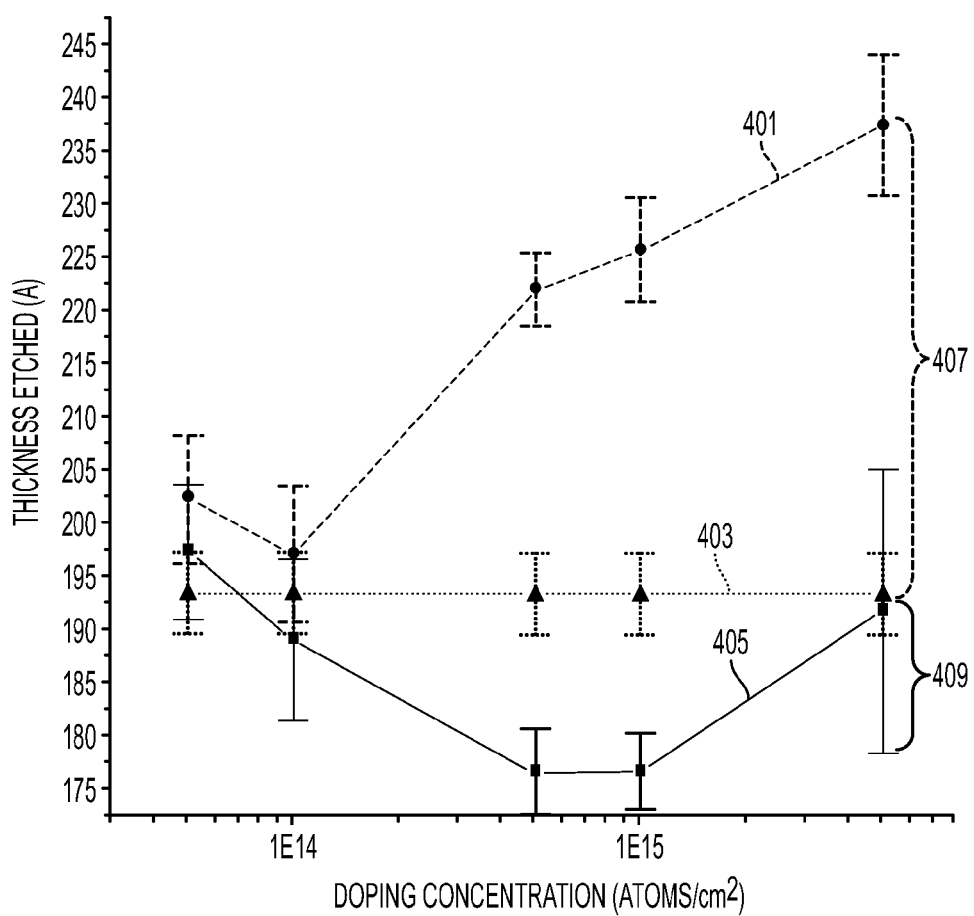
FIG. 4 is a graph of experimental results of different doping levels on etched thickness in accordance with various embodiments of the present disclosure.

Doping the dielectric layer between the fins with different materials at various concentrations can affect etch rates in a predictable amount to offset the etch loading effects. FIG. 4 is a graph of experimental results of different doping levels on etched thickness under same process conditions in accordance with various embodiments of the present disclosure. In FIG. 4, the etched thickness is plotted against doping concentration in units of atoms/cm$^2$. Depending on the dopant used, two types of etch rate effects are observed. In a first etch enhancing type regime 407 as represented by line 401, the amount etched increases with higher doping concentration, which means that the etch rate increases with higher doping concentration. In a second etch retarding type regime 409 as represented by line 405, the amount etched decreases with increasing doping concentration, which reflects decreasing etch rate. Line 403 shows the amount etched of a same undoped base material as the material used to obtain lines 401 and 405. Line 401 represents data from carbon doping at different doping concentrations. Line 405 represents data from arsenic doping at different doping concentrations. The material for all of lines 401, 403, and 405 is a blanket silicon oxide from a spin-on process. For lines 401 and 405, it is implanted with different dopants and doping concentrations at 10 keV.

When the doping concentration is small, there is only a small difference in the amount etched. Notably, at low concentrations of arsenic doping, the etching thickness appears to increase etch rate, however, the error bar of line 405 crosses the undoped line 403. Thus, at doping concentrations below about 1E14 atoms/cm$^2$, no significant change in etched thickness is observed. At doping concentrations of greater than about 5E14 atoms/cm$^2$, the lines 401 and 405 diverge from line 403. From about 5E14 to about 5E15, the etch rate for carbon doped silicon oxide increase at a constant rate. From about 5E14 to about 1E15 atoms/cm$^2$, the etch rate for arsenic doped silicon oxide stays relatively constant. At about 5E15 atoms/cm$^2$, the etch retardation effects decrease. Structural damage from the ion implantation at higher doses may weaken the silicon oxide such that any etch retardation effects disappear.

The data from FIG. 4 shows that selective doping can be used to change etch rates to counter etch loading effects. If an anticipated etch loading effect would result in one area to be etched more relative to another area, then an etch retardant may be doped in the one area or an etch enhancer, i.e., etch accelerator, may be doped in the other area. By using selective doping of different dopants or different ion densities, different fin density areas each have a finely tuned etch rate that results in a desirable fin height for the each area or for the entire device.

Etch accelerators include carbon, germanium, argon, helium, neon, or kypton. One category of etch accelerators are etch chemistry dependent, for example, carbon or germanium. For some etchants and processes, the presence of etch chemistry dependent etch accelerators increases the etch rate by acting as an activator, accelerator, or catalyst. These accelerators remain in the dielectric film after doping and are consumed during the etching process. Another category of etch accelerators are not etch chemistry dependent. Etch chemistry independent etch accelerators change the dielectric properties during the doping process to affect the etch rate. For example, ion implantation using a noble gas structurally weakens the dielectric and allows a subsequent etch process to have a higher reaction rate. This category of etch accelerators may not remain in the dielectric film after doping.

Etch retardants include arsenic, phosphorus, boron and aluminum. In some embodiments, etch retardants increase hardness of the dielectric layer and make the dielectric layer harder to etch, thus decreasing the etch rate. However, as shown in FIG. 4, at high doping concentration etch retardants may cause structural damage which minimizes the impact on the etching rate.

Using ion implantation as a doping method, the energy of the implantation is less than about 10 keV or between about 3 keV and about 5 keV. As shown in FIGS. 3A and 3B, the implantation also occurs over the fins 306 and 309. While the fins 306 and 309 are covered by the hardmask 307, which tends to protect the fins 306 and 309 from the implantation process, any particles that do implant in the fins 306 and 309, particularly those species that can affect electrical properties of the FinFET, is undesirable.

Figure 5:
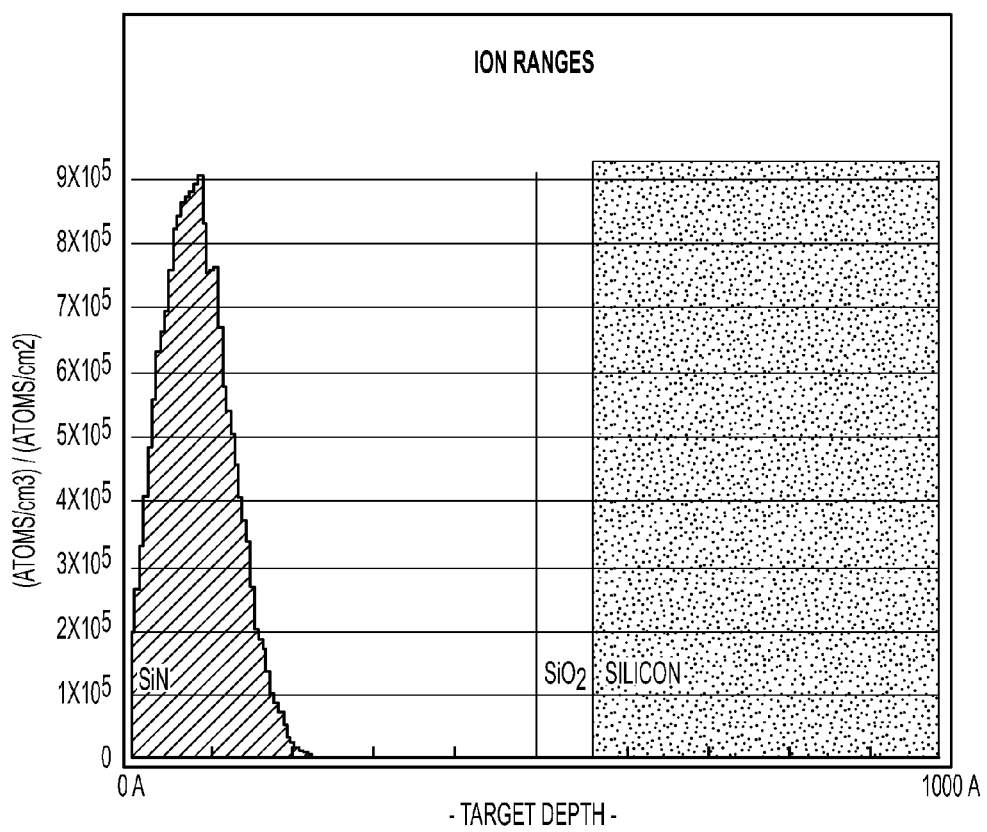
FIG. 5 is a graph of modeling results of doping concentration relative to depth over the fins for a doping process in accordance with various embodiments of the present disclosure.

FIG. 5 is a graph of modeling results of doping concentration relative to target depth over fins for a doping process in accordance with various embodiments of the present disclosure. FIG. 5 depicts ion concentration for a total target depth of 1000 angstroms, with a silicon nitride hardmask region for 500 angstroms near the surface, followed by about 70 angstroms of silicon oxide, and the silicon fin for about 430 angstroms. At an implantation energy of 3 eV, a majority of the dopants are concentrated near the surface in the silicon nitride. The peak concentration occurs at about 80 angstroms from the surface. The profile has a sigma of about 42 angstroms, where sigma is the standard deviation. A dopant concentration of 6-sigma from the peak concentration is found about 334 angstroms away from the surface, which is still far from the silicon fins. Thus, at low implantation energy of 3 keV, the silicon nitride hardmask more than adequately protect the silicon fins from the ion implantation process.

Figure 6:
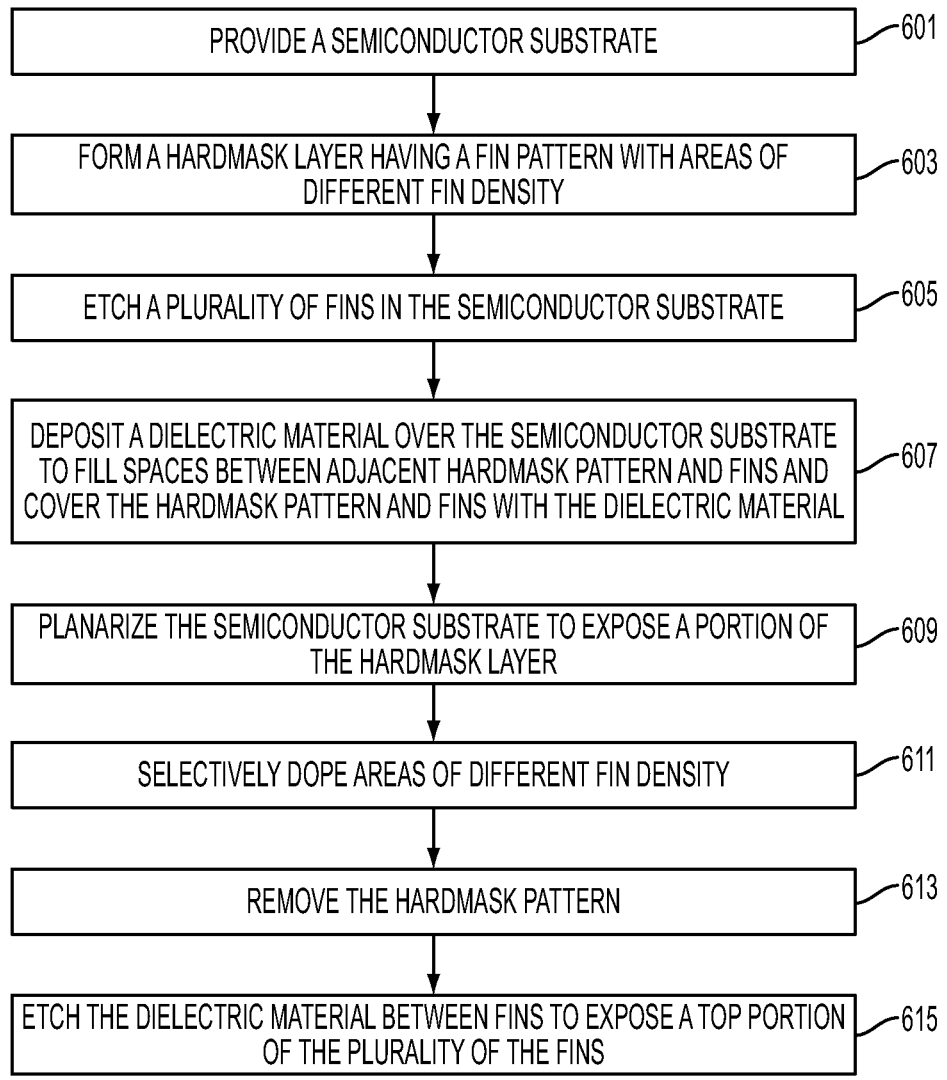
FIG. 6 is a flowchart of a method for fabricating FinFET structures in accordance with various embodiments of the present disclosure.

FIG. 6 is a flowchart of a method 600 for fabricating FinFET structures in accordance with various embodiments of the present disclosure. Cross section views of partially fabricated FinFETs according to various steps in the method embodiments of FIG. 6 are shown in FIGS. 7A to 7E. FIGS. 8A to 8E are graphs of dopant concentration profiles of partially fabricated FinFETs of FIGS. 7A to 7E according to various embodiments of the present disclosure. Respective cross sections of FIGS. 7A to 7E are discussed together with the corresponding concentration profiles in FIGS. 8A to 8E together with the operations of FIG. 6.

Referring to FIG. 6, a process flow 600 for fin height modulation is shown. At operation 601, a semiconductor substrate is provided. The semiconductor substrate may be a silicon substrate or a deposited silicon such as silicon-on-insulator (SOI) with a barrier oxide (BOX) layer between the SOI and the underlying silicon substrate. A hardmask adhesion layer may be first deposited over the semiconductor substrate. In operation 603, a hardmask layer having a fin pattern with areas of different fin density is formed on the semiconductor substrate. As discussed, the hardmask layer may be formed using different processes, including a mandrel/spacer process or pattern and etch of the hardmask layer. In operation 605, a plurality of fins is etched into the semiconductor substrate. Using a hardmask pattern as an etch pattern, silicon fins are formed by etching deep trenches in the semiconductor substrate.

In operation 607, a dielectric layer is deposited over the fins and hardmask pattern to completely cover the fins and hardmask pattern as well as filling the deep trench between the fins. The dielectric layer may be a silicon oxide, silicon nitride, or another dielectric material. In some embodiments, the dielectric layer is silicon oxide deposited using a spin-on deposition process (SOD) or a flowable chemical vapor deposition (CVD). Depending on the dimensions of the deep trench between the fins, conventional plasma assisted CVD such as plasma-enhanced CVD (PECVD) or high density plasma CVD (HDP CVD) may also be used if the aspect-ratio of the deep trench is sufficiently low.

In operation 609, the semiconductor substrate with the dielectric layer is planarized to expose a portion of the hardmask layer. A chemical mechanical polishing (CMP) process may be used to planarize the dielectric layer. FIG. 7A shows the partially fabricated FinFET after the planarization operation. The partially fabricated FinFET includes a silicon substrate 701 with fins 703 formed thereon. A thin hardmask adhesion layer 709 covers each fin 703 and a hardmask 705, usually a silicon nitride, covers the hardmask adhesion layer 709 and fins 703. Dielectric layer 707 fills the trenches between the fins 703. A top surface of the partially fabricated FinFET includes exposed hardmask 705 and dielectric layer 707.

Figure 8D:
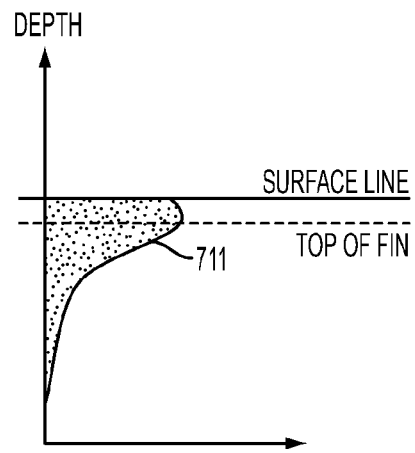

FIG. 8A shows a concentration profile of a dopant along line 711 within the dielectric layer 707. The depth is shown on the y-axis from a surface line corresponding to the top surface of the partially fabricated FinFET and the x-axis shows a concentration of a dopant. Because no doping has yet to take place, there is no dopant concentration profile in FIG. 8A. A surface line and a top of fin line are indicated in FIGS. 8A to 8E to show the relative depths.

Referring back to FIG. 6, in operation 611, areas of different fin density are selectively doped. As discussed in association with FIGS. 3A and 3B, the selective doping may be performed in a variety of ways including using a photomask to cover regions during implantation or thermal diffusion, or using area-specific ion implantation. FIG. 7B shows ion implantation on the partially fabricated FinFET. Arrows 715 symbolize ion implantation of dopants into the hardmask 705 and the dielectric layer 707. In some embodiments, selective doping may be performed during the dielectric deposition by depositing the dielectric along with a dopant for one or more areas while the other areas are covered by a mask. The mask is then removed before the dielectric is deposited with a different dopant concentration or no dopant over the previously covered area.

FIG. 8B shows concentration profile of a dopant along line 711 within the dielectric layer 707 and along line 713 through the hardmask 705, hardmask adhesion layer 709, and fin 703. The depth is shown on the y-axis from a surface line corresponding to the top surface of the partially fabricated FinFET and the x-axis shows a concentration of a dopant. The concentration profile along line 711 increases steadily to a peak concentration at about the top of the fins and decreases with a tail into the dielectric layer. The concentration profile along line 713 increases rapidly with a peak close to the surface and quickly declines with a minimal tail. The different concentration profiles result from the material properties of the doped material. The dielectric layer 707 is silicon oxide from a spin-on process or a flowable CVD process. The dielectric layer 707 has a lower density relative to the hardmask 705, which is usually a silicon nitride. The concentration profiles can be controlled at least partially by implantation process parameters such as dopant concentration and energy as well as subsequent annealing conditions. Because a dopant concentration in the fins 703 can affect the electrical properties of the FinFET, a concentration profile over the fins 703 such that there is no tail and the peak concentration occurs near the surface or in the hardmask 705 is desirable. According to some embodiments, the concentration profile along line 713 is controlled so that the peak concentration depth plus 6-sigma of the profile ($Depth_{peak} + 6 * \sigma_{conc}$) is less than a height of the hardmask. When the peak concentration depth plus 6-sigma is less than the height of the hardmask, essentially no dopant is found in the fins.

Referring back to FIG. 6, in operation 613, the hardmask pattern is removed. An etching process removes the hardmask 705 from the partially fabricated FinFET as shown in FIG. 7C. The partially fabricated FinFET includes fins 703, dielectric layer 707 between the fins 703, and a hardmask adhesion layer 709 over the fins 703. The concentration profile of FIG. 8C shows only a concentration profile along line 711. The concentration profile along line 711 of FIG. 8C has a near-surface portion removed relative to the concentration profile 711 of FIG. 8B because a small amount of the dielectric layer 707 is removed with the hardmask 705. There is no concentration profile for line 713 because no dopant is implanted or diffused past the hardmask 705.

Figure 7D:
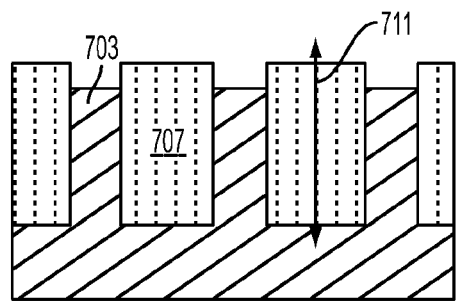
Figure 7E:
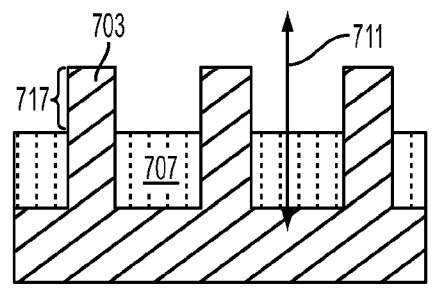
Figure 8E:
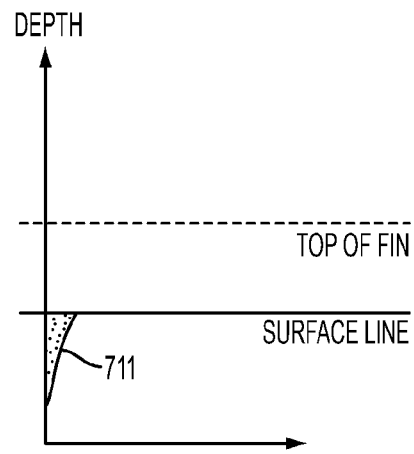

In operation 615 of FIG. 6, the remaining dielectric material is etched to expose a top portion of the fins. According to some embodiments, this operation may be performed in two steps. The hardmask adhesion layer 709 may be a different material from the dielectric layer 707. In a first step, the hardmask adhesion layer 709 above the fins 703 is removed as shown in FIG. 7D. The removal of the hardmask adhesion layer 709 may also include removal of a small portion of the dielectric layer 707. FIG. 8D shows the remaining concentration profile along line 711 for the dielectric layer 707, with the surface line moving a small amount down the concentration profile. The second step removes more of the dielectric layer 707 to expose a top portion 717 of the fins 703 as shown in FIG. 7E. As shown in FIG. 8E, only a concentration tail is left of the concentration profile along line 711 after removing more of the dielectric layer 707. The dopant concentration tail is in the dielectric layer and located below a channel area for the FinFET and thus does not affect the electrical properties of the FinFET.

This concentration tail is different in different portions of the semiconductor device that experienced different doping concentrations. In areas that are protected from the doping process, no concentration tail would remain. In areas that experienced less doping, a smaller concentration tail would remain. In areas that experienced more doping, a larger concentration tail would remain in the dielectric layer. Thus by examining the dopant concentration tails in the dielectric layer, one skilled in the art would be able to determine whether these areas experienced selective doping. As discussed above, the selective doping is used to change etch rates to counter the etch loading effects in areas of different fin densities. Because the doping can be used to control etch selectivities, fin heights in different areas can be precisely controlled to be the same or specified to be a certain height.

Experiments were conducted according to various concepts of the present disclosure to apply selective doping to areas of different fin density to render a uniform fin height. Semiconductor dies having three different regions were used: a memory region, a logic region, and a peripheral input/output region. The memory region has a low fin density, the logic region has an intermediate density, and the peripheral input/output region has a highest fin density that is closer to the intermediate density than the low fin density. In a first case, no implantation was performed. The memory area fin heights were between 17 nm and 21.5 nm. The logic area fin heights were between 25 and 27 nm. The peripheral area fin height was between about 29 nm and 30 nm. The fin heights varied as much as 43 percent from the memory area to the peripheral area. In a second case, a carbon ion implantation was performed in the memory region. The implantation was conducted at low energy of 3 keV at a dosage of 2E14 atoms/cm$^2$. The memory area fin heights were between 31 nm and 34.5 nm. The logic area fin heights were about 31.5 nm. The peripheral area fin heights were about 33 nm. The fin heights varied only about 10 percent from the memory area to the periphery area. In a third case, a carbon ion implantation was performed in the memory region. The implantation was conducted at low energy of 3 keV at a dosage of 2E15 atoms/cm$^2$. The memory area fin heights were about 39 nm. The logic area fin heights were between about 34.5 nm and 35.5 nm. The peripheral area fin height was about 35.5 nm. The fin heights varied about 12 percent from the memory area to the periphery area. The experimental data shows that selective doping can be used to change etch selectivities such to counter various etch loading effects. Given additional process tuning, one skilled in the art should be able to reduce the fin height variation even further, to less than 10 percent or even about 5 percent or less.

One aspect of this description relates to an apparatus. The apparatus includes a semiconductor substrate having a plurality of fins, wherein the plurality of fins includes a first group of fins and a second group of fins. The apparatus further includes a high fin density area on the semiconductor substrate including a first dielectric between the first group of fins in the high fin density area, said first dielectric having a first dopant concentration. The apparatus further includes a low fin density area on the semiconductor substrate including a second dielectric between the second group of fins in the low fin density area, said second dielectric having a second dopant concentration. The first dielectric and the second dielectric are a same material as deposited and the first dopant concentration and the second dopant concentration are different.

Another aspect of this description relates to an apparatus. The apparatus includes a substrate, and a first plurality of fins having a first pitch in a first region of the substrate. The apparatus further includes a second plurality of fins having a second pitch in a second region of the substrate, wherein the second pitch is different from the first pitch. The apparatus further includes a dielectric material between fins of the first plurality of fins and between fins of the second plurality of fins, wherein the dielectric material in the first region has a different dopant concentration from the dielectric material in the second region.

Still another aspect of this description relates to an apparatus. The apparatus includes a substrate, and a first plurality of fins having a first pitch in a first region of the substrate. The apparatus further includes a second plurality of fins having a second pitch in a second region of the substrate, wherein the second pitch is different from the first pitch. The apparatus further includes a dielectric material between fins of the first plurality of fins and between fins of the second plurality of fins, wherein an etch selectivity of the dielectric material in the first region is different from an etch selectivity of the dielectric material in the second region.

Although the embodiments and advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. An apparatus comprising:
   a semiconductor substrate having a plurality of fins, wherein the plurality of fins includes a first group of fins and a second group of fins;
   a high fin density area on the semiconductor substrate including a first dielectric between the first group of fins in the high fin density area, said first dielectric having a first dopant concentration; and
   a low fin density area on the semiconductor substrate including a second dielectric between the second group of fins in the low fin density area, said second dielectric having a second dopant concentration;
   wherein the first dielectric and the second dielectric are a same material as deposited and the first dopant concentration and the second dopant concentration are different.

2. The apparatus of claim 1, wherein the plurality of fins have a substantially same height.

3. The apparatus of claim 1, wherein fin heights of the plurality of fins have a uniformity of about or greater than 95%.

4. The apparatus of claim 1, wherein the first dopant concentration and the second dopant concentration comprise a concentration of carbon or germanium.

5. The apparatus of claim 1, wherein the first dopant concentration and the second dopant concentration comprise a concentration of arsenic, phosphorous, or boron.

6. An apparatus comprising:
   a substrate;
   a first plurality of fins having a first pitch in a first region of the substrate;
   a second plurality of fins having a second pitch in a second region of the substrate, wherein the second pitch is different from the first pitch; and a dielectric material between fins of the first plurality of fins and between fins of the second plurality of fins, wherein the dielectric material in the first region has a different dopant concentration from the dielectric material in the second region, and the first region has a different etch rate from the second region.

7. The apparatus of claim 6, wherein at least one of the first plurality of fins or the second plurality of fins is part of a logic device.

8. The apparatus of claim 6, wherein at least one of the first plurality of fins or the second plurality of fins is part of a memory device.

9. The apparatus of claim 6, wherein at least one of the first plurality of fins or the second plurality of fins is part of an input/output device.

10. The apparatus of claim 6, wherein a width of fins of the first plurality of fins is different form a width of fins of the second plurality of fins.

11. The apparatus of claim 6, further comprising a gate electrode over fins of the first plurality of fins.

12. The apparatus of claim 6, wherein a doping concentration tail of the dielectric material in the first region is different from a doping concentration tail of the dielectric material in the second region.

13. The apparatus of claim 6, further comprising a third plurality of fins having a third pitch in a third region of the substrate, wherein the third pitch is different from the first pitch and from the second pitch.

14. The apparatus of claim 13, wherein the dielectric material is between fins of the third plurality of fins, and the dielectric material in the third region has a different dopant concentration from the dopant concentration of the dielectric material in the first region and from the dopant concentration of the dielectric material in the second region.

15. The apparatus of claim 6, wherein the first dopant concentration ranges from about 1E14 atoms/cm$^2$ to about 4E15 atoms/cm$^2$.

16. An apparatus comprising:
a substrate;
a first plurality of fins having a first pitch in a first region of the substrate;
a second plurality of fins having a second pitch in a second region of the substrate, wherein the second pitch is different from the first pitch; and
a dielectric material between fins of the first plurality of fins and between fins of the second plurality of fins, wherein an etch selectivity of the dielectric material in the first region is different from an etch selectivity of the dielectric material in the second region.

17. The apparatus of claim 16, wherein the dielectric material in the second region is undoped.

18. The apparatus of claim 16, wherein the first pitch is less than the second pitch, and the etch selectivity of the dielectric material in the first region is higher than the etch selectivity of the dielectric material in the second region.

19. The apparatus of claim 16, wherein a top of fins in the first plurality of fins is substantially level with a top of fins in the second plurality of fins.

20. The apparatus of claim 16, wherein the dielectric material comprises a same base material in the first region and in the second region.

* * * * *